(12) United States Patent
Shimauchi et al.

(10) Patent No.: US 11,653,446 B2
(45) Date of Patent: May 16, 2023

(54) LAMINATED PLATE

(71) Applicant: NIPPON PILLAR PACKING CO., LTD., Osaka (JP)

(72) Inventors: Koichi Shimauchi, Osaka (JP); Yoshitsugu Furui, Osaka (JP)

(73) Assignee: NIPPON PILLAR PACKING CO., LTD., Osaka (JP)

( * ) Notice: Subject to any disclaimer, the term of this patent is extended or adjusted under 35 U.S.C. 154(b) by 158 days.

(21) Appl. No.: 16/354,936

(22) Filed: Mar. 15, 2019

(65) Prior Publication Data

US 2019/0289713 A1 Sep. 19, 2019

(30) Foreign Application Priority Data

Mar. 16, 2018 (JP) .............. JP2018-049383

(51) Int. Cl.
| | |
|---|---|
| *H05K 1/03* | (2006.01) |
| *B32B 15/085* | (2006.01) |
| *C08L 27/18* | (2006.01) |
| *C08J 9/00* | (2006.01) |
| *H05K 1/02* | (2006.01) |
| *B32B 15/20* | (2006.01) |

(52) U.S. Cl.
CPC ......... *H05K 1/0373* (2013.01); *B32B 15/085* (2013.01); *B32B 15/20* (2013.01); *C08J 9/0061* (2013.01); *C08L 27/18* (2013.01); *H05K 1/024* (2013.01); *B32B 2307/202* (2013.01); *B32B 2307/206* (2013.01); *C08J 2327/18* (2013.01); *C08J 2483/04* (2013.01); *H05K 2201/015* (2013.01); *H05K 2201/0162* (2013.01)

(58) Field of Classification Search
None
See application file for complete search history.

(56) References Cited

U.S. PATENT DOCUMENTS

| | | | |
|---|---|---|---|
| 6,417,459 B1 | 7/2002 | Kanzaki et al. | |
| 7,687,142 B2 | 3/2010 | Iwasa et al. | |
| 8,129,869 B2 | 3/2012 | Kashiwagi | |
| 2006/0113862 A1* | 6/2006 | Suzuki | H02N 1/004 310/309 |
| 2007/0246255 A1 | 10/2007 | Iwasa et al. | |
| 2010/0015404 A1* | 1/2010 | Paul | H05K 1/0373 156/60 |

(Continued)

FOREIGN PATENT DOCUMENTS

| | | | |
|---|---|---|---|
| CN | 107663367 A | * | 2/2018 |
| JP | 62201242 A | * | 9/1987 |
| JP | H10226009 A | | 8/1998 |

(Continued)

OTHER PUBLICATIONS

English machine translation CN 107663367 (Feb. 6, 2018).*

(Continued)

*Primary Examiner* — Kenneth J Stachel
(74) *Attorney, Agent, or Firm* — Millen, White, Zelano & Branigan, PC; Ryan Pool (57) ABSTRACT

A laminated plate has a metallic conductive layer layered on one surface or each surface of an insulating substrate, the insulating substrate contains a fluorine resin and a polymer of an alkoxysilane, and the fluorine resin is dispersed in the polymer of the alkoxysilane.

4 Claims, 5 Drawing Sheets

(56) References Cited

U.S. PATENT DOCUMENTS

2011/0166299 A1     7/2011   Kashiwagi
2014/0151893 A1*   6/2014   Boyanov ........... H01L 21/76883
                                                                     257/774

FOREIGN PATENT DOCUMENTS

| JP | 2000286255 A | 10/2000 |
|---|---|---|
| TW | 201028021 A | 7/2010 |
| WO | 2001003478 A1 | 1/2001 |
| WO | 06062138 A1 | 6/2006 |

OTHER PUBLICATIONS

English machine translation of JPS62201242 with Abst 1987-288252 (1987).*
Shichun Qu Mat_Res_Soc_Symp_Proc_vol. 581 pp. 375-380 2000.*
Chen et al Jl Polymer Science Part A Polymer Chem vol. 42, 1789-1807 (2004).*
English Machine Translation for JPH10-226009, Publication Date: Aug. 25, 1998.

* cited by examiner

LAMINATED PLATE

TECHNICAL FIELD

The present invention relates to a laminated plate used for a high frequency board and the like.

This application claims priority on Japanese Patent Application No. 2018-049383 filed on Mar. 16, 2018, the entire contents of which are incorporated herein by reference.

BACKGROUND ART

A fluorine resin is generally used as a material for an electronic component for high frequency, since it has a low dielectric tangent, a low dielectric constant, etc.

For example, a printed wiring board having a metal foil layered on a prepreg (insulating substrate) that contains a fluorine resin is well known as a high frequency board (see, for example, PATENT LITERATURE 1).

CITATION LIST

Patent Literature

PATENT LITERATURE 1: International Publication No. 2001/003478

PATENT LITERATURE 2: Japanese Laid-Open Patent Publication No. H10-226009

SUMMARY OF INVENTION

Technical Problem

Meanwhile, a fluorine resin molded product has a large number of fine pores therein. Thus, in a high frequency board including an insulating substrate containing a fluorine resin as disclosed in PATENT LITERATURE 1, moisture enters pores of the insulating substrate in some cases. When moisture has entered the insulating substrate, the entry of moisture may change the dielectric tangent of the high frequency board, resulting in an increase in line loss of the high frequency board.

In addition, as a technique to impart moisture resistance to a printed wiring board and prevent deterioration of peeling strength after a pressure cooker test, PATENT LITERATURE 2 proposes using a copper foil, for a printed wiring board, that has a mixture coating layer formed from a silane coupling agent and a polysiloxane, on a to-be-adhered surface of the copper foil. However, in the technique of PATENT LITERATURE 2, it is impossible to sufficiently prevent moisture from entering the interior of the insulating substrate containing the fluorine resin. Therefore, as a high frequency board including an insulating substrate containing a fluorine resin, a board that is less likely to absorb water and of which the dielectric tangent is less likely to change, is desired.

The present inventors have conducted thorough research in order to meet such a demand, and have completed the present invention.

Solution to Problem

A laminated plate according to the present invention is a laminated plate having a metallic conductive layer layered on one surface or each surface of an insulating substrate, wherein the insulating substrate contains a fluorine resin and a polymer of an alkoxysilane, and the fluorine resin is dispersed in the polymer of the alkoxysilane.

Since the insulating substrate that forms the laminated plate contains a fluorine resin and a polymer of an alkoxysilane and the fluorine resin is dispersed in the polymer of the alkoxysilane, the number of fine pores is very small (or no fine pores are present), and water absorption in which moisture enters pores is less likely to occur. Thus, a change in dielectric tangent due to the above water absorption is less likely to occur, and excellent high frequency characteristics can be maintained over a long period of time even in use in a high humidity environment.

In the laminated plate, preferably, the alkoxysilane is an alkyltrialkoxysilane, and the number of carbon atoms of an alkyl group of the alkyltrialkoxysilane is 3 to 9.

In this case, a polymer of the alkyltrialkoxysilane having an alkyl group having 3 to 9 carbon atoms has particularly excellent hydrophobicity, and thus the laminated plate becomes a laminated plate that is further less likely to absorb water.

In the laminated plate, the fluorine resin is preferably polytetrafluoroethylene (PTFE).

Polytetrafluoroethylene is a fluorine resin that allows fine pores to be easily generated within a molded product thereof, among fluorine resins. Thus, polytetrafluoroethylene is particularly suitable as the fluorine resin used in combination with the polymer of the alkoxysilane in the insulating substrate according to the present invention.

In the laminated plate, the insulating substrate preferably further contains an inorganic filler.

By blending the inorganic filler into the insulating substrate, the dielectric constant of the insulating substrate can be adjusted.

Furthermore, the linear expansion coefficient of the insulating substrate can be decreased by blending the inorganic filler.

In addition, since the laminated plate contains the polymer of the alkoxysilane, water absorption by the inorganic filler can also be inhibited.

In the laminated plate, the insulating substrate preferably has a porosity of not greater than 5%.

When the porosity of the insulating substrate is not greater than 5%, an increase in dielectric tangent in the case where the laminated plate has been used in a high humidity environment over a long period of time can be significantly inhibited.

Advantageous Effects of Invention

Since the laminated plate according to the present invention has the above-described configuration, the dielectric tangent of the laminated plate is less likely to change even when the laminated plate has been used in a high humidity environment over a long period of time, and the laminated plate has excellent high frequency characteristics.

DESCRIPTION OF EMBODIMENTS

Hereinafter, embodiments of the present invention will be described with reference to the drawings.

First Embodiment

Figure 1:
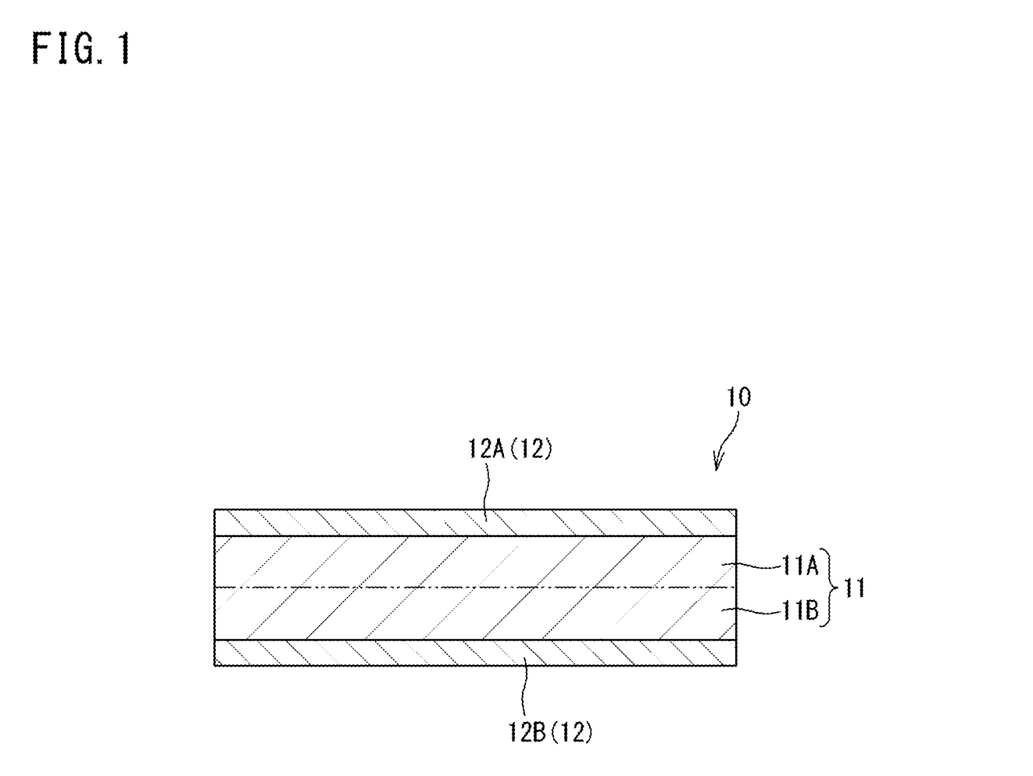
FIG. 1 is a cross-sectional view schematically showing an example of a laminated plate according to an embodiment of the present invention.

FIG. 1 is a cross-sectional view schematically showing an example of a laminated plate according to an embodiment of the present invention.

As shown in FIG. 1, a laminated plate 10 according to the present embodiment includes an insulating substrate 11 and a conductive layer 12 (12A, 12B) provided on each surface of the insulating substrate 11. As will be described later, the insulating substrate 11 is a layer formed by thermally compression-bonding gel layers to each other, and layers 11A and 11B formed by solidifying the gel layers are integrated therein.

The insulating substrate 11 contains a fluorine resin, a polymer of an alkoxysilane, and an inorganic filler.

Examples of the fluorine resin include polytetrafluoroethylene (PTFE), perfluoroalkoxyalkane (PFA), perfluoroethylene-propene copolymer (FEP), ethylene-tetrafluoroethylene copolymer (ETFE), tetrafluoroethylene-perfluorodioxole copolymer (TFE/PDD), polyvinylidene fluoride (PVDF), polychlorotrifluoroethylene (PCTFE), ethylene-chlorotrifluoroethylene copolymer (ECTFE), and polyvinyl fluoride (PVF). These resins may be used individually, or two or more of these resins may be used in combination.

The fluorine resin may be linear, or may have a branched chain, but is preferably linear from the viewpoint of having excellent compatibility with the polymer of the alkoxysilane.

The fluorine resin is more preferably polytetrafluoroethylene (PTFE).

As the alkoxysilane, a compound having a trialkoxysilyl group in which three alkoxy groups are directly bonded to a silicon atom, is used. As the alkoxysilane, in addition to the compound having a trialkoxysilyl group, a compound having a dialkoxysilyl group in which two alkoxy groups are directly bonded to a silicon atom, may be used in combination.

Specific examples of the compound having a trialkoxysilyl group include methyltrimethoxysilane, ethyltrimethoxysilane, phenyltrimethoxysilane, methyltriethoxysilane, ethyltriethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, decyltriethoxysilane, 1,6-bis(trimethoxysilyl)hexane, 1,6-bis(triethoxysilyl)hexane, trifluoropropyltrimethoxysilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropyltriethoxysilane, p-styryltrimethoxysilane, 3-methacryloxypropyltrimethoxysilane, 3-methacryloxypropyltriethoxysilane, 3-acryloxypropyltrimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, tris-(trimethoxysilylpropyl)isocyanurate, (tridecafluoro-1,1,2,2-tetrahydrooctyl)triethoxysilane, and (heptadecafluoro-1,1,2,2-tetrahydrodecyl)triethoxysilane. These compounds may be used individually, or two or more of these compounds may be used in combination.

Examples of the compound having a dialkoxysilyl group include 3-glycidoxypropylmethyldimethoxysilane, 3-glycidoxypropylmethyldiethoxysilane, 3-methacryloxypropylmethyldimethoxysilane, 3-methacryloxypropylmethyldiethoxysilane, and N-2-(aminoethyl)-3-aminopropylmethyldimethoxysilane. These compounds may be used individually, or two or more of these compounds may be used in combination.

The alkoxysilane is preferably an alkyltrialkoxysilane.

The alkyl group of the alkyltrialkoxysilane is preferably an alkyl group having 3 or more carbon atoms, and more preferably an alkyl group having 5 to 9 carbon atoms.

In this case, the alkoxysilane is particularly suitable for imparting hydrophobicity to the insulating substrate and inhibiting water absorption of the insulating substrate.

The contained amount of the polymer of the alkoxysilane per 100 parts by weight of the fluorine resin is preferably 0.3 to 4.0 parts by weight. In this case, such an amount is suitable for forming a sea-island structure in which the polymer of the alkoxysilane forms a sea part and the fluorine resin forms an island part.

In addition, the sea-island structure in which the polymer of the alkoxysilane forms a sea part and the fluorine resin forms an island part is suitable as a structure that decreases the porosity of the insulating substrate.

Examples of the material of the inorganic filler include barium titanate represented by $BaTi_{14}O_9$, $BaTi_5O_{11}$, and $Ba_2Ti_9O_{20}$, titania represented by $TiO_2$, $Mg_2SiO_4$ (forsterite), and inorganic substances represented by $SiO_2$ such as amorphous silica, crystalline silica, quartz, and synthetic silica. These materials may be used individually, or two or more of these materials may be used in combination.

By blending these inorganic fillers, the absolute value of the linear expansion coefficient of the insulating substrate can be decreased. Therefore, deformation of the insulating substrate due to a temperature change can be inhibited.

For the insulating substrate that forms the laminated plate according to the embodiment of the present invention, it is important to adjust the dielectric constant of the insulating substrate in accordance with use or size. Meanwhile, the dielectric constant of each of the fluorine resin and the polymer of the alkoxysilane does not greatly differ even when the structure differs.

Therefore, the dielectric constant of the insulating substrate is preferably adjusted through selection of the inorganic filler.

For example, in the case where the insulating substrate contains the above-described inorganic filler, the inorganic filler only needs to be selected as appropriate in accordance with a design value for the dielectric constant of the insulating substrate, in consideration of the fact that: inorganic fillers composed of barium titanate, titania, and forsterite are inorganic fillers each having a dielectric constant exceeding 8; and inorganic fillers composed of amorphous silica, crystalline silica, quartz, and synthetic silica are inorganic fillers each having a dielectric constant less than 4. Specifically, for example, in the case of increasing the dielectric constant of the insulating substrate, an inorganic filler having a dielectric constant exceeding 8 only needs to be selected, and, in the case of decreasing the dielectric constant of the insulating substrate, an inorganic filler having a dielectric constant less than 4 only needs to be selected. As a matter of course, a combination of an inorganic filler having a dielectric constant exceeding 8 and an inorganic filler having a dielectric constant less than 4 may be selected.

The shape of the inorganic filler is not particularly limited, but examples thereof include a spherical shape, an elliptical shape, a crushed shape, and a lump shape.

The inorganic filler may be subjected to a surface treatment.

Examples of the method for the surface treatment include a method in which the inorganic filler is treated by a known integral blend method using an alkoxysilane such as methyltrimethoxysilane, ethyltrimethoxysilane, phenyltrimethoxysilane, methyltriethoxysilane, ethyltriethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, decyltriethoxysilane, 1,6-bis(trimethoxysilyl)hexane, 1,6-bis(triethoxysilyl)hexane, trifluoropropyltrimethoxysilane, vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, tris-(trimethoxysilylpropyl)isocyanurate, (tridecafluoro-1,1,2,2-tetrahydrooctyl)triethoxysilane, and (heptadecafluoro-1,1,2,2-tetrahydrodecyl)triethoxysilane.

By performing such a surface treatment, the adhesiveness between the polymer of the alkoxysilane and the inorganic filler can be enhanced.

The contained amount of the inorganic filler is preferably 30 to 70% by weight with respect to the insulating substrate.

If the contained amount of the inorganic filler is less than 30% by weight, the absolute value of the linear expansion coefficient of the insulating substrate may be excessively great. On the other hand, if the contained amount of the inorganic filler exceeds 70% by weight, the amount of the fluorine resin may be excessively small, resulting in difficulty in molding the insulating substrate.

In the laminated plate, the porosity of the insulating substrate is preferably not greater than 5%.

When the porosity is not greater than 5%, an increase in dielectric tangent in the case where the laminated plate has been used in a high humidity environment over a long period of time can be significantly inhibited.

In the embodiment of the present invention, the porosity is determined by the following method.

A cross-section of the insulating substrate along the thickness direction thereof is observed with a scanning electron microscope (SEM), a partial region within an obtained observation image is set as an analysis range, an area S2 of the analysis range and an area S1 occupied by pores within the analysis range are calculated, and a porosity is calculated by the following calculation formula (1).

$$\text{Porosity (\%)} = (S1/S2) \times 100 \quad (1)$$

Here, as the observation image to be analyzed, a representative observation image within one field of view selected from among observation images within 10 fields of view is used.

As the method for calculating the area S1 occupied by the pores, the following method may be used.

Signal intensity of a reflected electron image of the SEM (Scanning Electron Microscope) may be divided to 256 levels, black may be set to an intensity of 0, white may be set to an intensity of 255, a portion in which the signal intensity is not greater than 100 may be determined as a pore, and the sum of regions in which the signal intensity is not greater than 100 may be calculated as the area S1 occupied by the pores.

At this time, the signal intensity may be determined per 1 pixel=0.0278 μm×0.0278 μm. In addition, the analysis range may be set as 1208 pixels (33.5824 μm) in length and 2048 pixels (56.9344 μm) in width, and the area S2 of the analysis range may be set to 2473984 pixel$^2$ (1912.0 μm$^2$).

Next, a method for producing the laminated plate will be described.

The laminated plate can be produced, for example, through the following steps (1) to (4).

(1) First, an application liquid (sol liquid) containing a fluorine resin, an alkoxysilane, and an inorganic filler, a solvent, etc., for producing the insulating substrate, is prepared.

Here, the fluorine resin can be supplied as pellets, an aqueous dispersion liquid of the fluorine resin, a dispersion liquid of the fluorine resin in an organic solvent, or a dispersion liquid of the fluorine resin in a mixed solvent of water and an organic solvent. In addition, in the case of supplying the fluorine resin in form of a dispersion liquid, water and/or an organic solvent contained in the dispersion liquid can be used as a solvent for the sol liquid.

In this step, for mixing each component, the application liquid may be prepared by adding a surfactant, preferably, a nonionic surfactant.

In preparation of the application liquid, raw material components such as the fluorine resin, the alkoxysilane, the inorganic filler, the solvent, and the surfactant are blended, and a sol liquid containing a silanol obtained by hydrolyzing the alkoxysilane is prepared. Here, as the method for hydrolyzing the alkoxysilane to form the silanol, a publicly known method can be used, and, for example, a method in which a mixture of the raw material components is stirred, etc., can be used.

(2) Next, a coating film composed of a sol layer is formed by applying the application liquid prepared in the step (1).

As a to-be-coated material on which the coating film is to be formed, for example, a support made of a resin, a thin metal strip, or the like can be used.

Here, in the case where a thin metal strip is used as the to-be-coated material, the thin metal strip can be used as the conductive layer of the completed laminated plate. Thus, the use of the thin metal strip is economically advantageous. As the thin metal strip, an aluminum foil or a copper foil is preferable since it is suitable as a conductive layer of a high frequency board.

Examples of the support made of the resin include plastic films formed from polyethylene terephthalate, polyamide-imide, polyimide, and the like.

A surface of the to-be-coated material to which the sol liquid is to be applied may be subjected to a surface treatment.

In the case where the to-be-coated material is a thin metal strip, examples of the surface treatment include a pretreatment with a treatment liquid containing a silane coupling agent. By performing the surface treatment, the adhesiveness between the insulating substrate and the conductive layer (thin metal strip) can be enhanced in the completed laminated plate.

In the case where the to-be-coated material is a support made of a resin, examples of the surface treatment include a publicly known mold release treatment.

As the method for applying the application liquid to the to-be-coated material, for example, publicly known methods, such as a dip method, a gravure method, and a doctor blade method, can be used. Among them, a doctor blade method is preferable from the viewpoint of easily ensuring uniformity of the coating thickness and easily increasing the thickness.

(3) Next, in the sol liquid applied to the to-be-coated material, gelation, in which the silanol is condensed to form a polysiloxane, is caused to proceed. Here, a heating treatment (drying treatment) is performed for promoting the condensation reaction of the silanol. In this step, a gel layer can be formed on one surface of the to-be-coated material.

In the heating treatment, the solvent and the surfactant may be evaporated.

The temperature of the heating treatment normally may be about 80 to 320° C.

(4) Finally, the laminated plate is completed through the following step (4-1) or step (4-2).

(4-1) In the case where a thin metal strip is used as the to-be-coated material in the above step (2), two thin metal strips on which gel layers produced through the above step (3) have been formed are used, and are placed such that the gel layers face each other, and thermal compression bonding is performed thereon. Accordingly, the gel layers can be thermally compression-bonded to each other, and a laminated plate, in which conductive layers composed of the thin metal strips are provided on both surfaces of an insulating substrate formed by the gel layers being solidified, can be obtained.

(4-2) In the case where a support made of a resin is used as the to-be-coated material in the above step (2), only the support is peeled from the support on which a gel layer produced through the above step (3) has been formed, such that the gel layer is left, thin metal strips are placed on both surfaces of the gel layer, and thermal compression bonding is performed thereon. In this case as well, a laminated plate, in which conductive layers composed of the thin metal strips are provided on both surfaces of an insulating substrate, can be obtained.

The thermal compression bonding treatment to be performed in the above step (4-1) or the above step (4-2) is preferably carried out under a vacuum or reduced pressure, or in an inert gas atmosphere, etc., such that the thin metal strips are not oxidized. In the thermal compression bonding treatment, for example, pressure may be applied at a temperature higher than the softening point of the fluorine resin for 30 minutes to several hours, then cooling may be performed to 121° C. or lower, and the pressure may be subsequently released.

The type of the thermal compression bonding treatment may be a batch type or may be a continuous type.

By using such a production method, the laminated plate according to the embodiment of the present invention can be suitably produced. In the above production method, the polysiloxane (the polymer of the alkoxysilane) obtained through the step of gelling the alkoxysilane binds the inorganic fillers to each other or the inorganic filler and the thin metal strip to each other, and further the polysiloxane surrounds the fluorine resin having low surface energy and poor adhesion (forms a sea-island structure in which the polysiloxane forms a sea part and the fluorine resin forms an island part). Thus, the above production method is suitable for producing a laminated plate having low water absorption due to a small number of pores.

Second Embodiment

Although the conductive layer 12 is layered on each surface of the insulating substrate 11 in the laminated plate 10 shown in FIG. 1, the conductive layer does not necessarily need to be formed on each surface of the insulating substrate, and may be formed on only one surface of the insulating substrate, in the laminated plate according to the embodiment of the present invention.

In the case of producing a laminated plate in which a conductive layer is formed on only one surface of an insulating substrate, for example, in the step (4) in the production method for the laminated plate according to the first embodiment, one thin metal strip having a gel layer formed on one surface thereof may be prepared, and an insulating substrate may be formed by performing a heating treatment on the gel layer. Alternatively, from a support made of a resin and having a gel layer formed thereon, only the support may be peeled such that the gel layer is left, a thin metal strip may be placed on one surface of the gel layer, and thermal pressure bonding may be performed thereon.

Other Embodiments

Although the insulating substrate, which forms the laminated plate, is produced using the sol-gel method in the above-described embodiment, the method for producing the insulating substrate is not limited to the method using the sol-gel method, and may be a method using another publicly known method, for example, a method of extrusion, calender molding, or the like.

EXAMPLES

Hereinafter, the embodiments of the present invention will be more specifically described by means of examples, but the present invention is not limited to the examples below.

Example 1

In the present example, the following materials were used as raw materials (reagents).

Decyltrimethoxysilane was used as an alkoxysilane.

An aqueous dispersion liquid of polytetrafluoroethylene (58% by weight) was used as a reagent of a fluorine resin.

Inorganic powder (having a dielectric constant less than 4) containing amorphous silica as a main component and subjected to a surface treatment in advance was used as an inorganic filler. Here, the surface treatment is carried out by treating 100 parts by weight of the inorganic powder using decyltrimethoxysilane (1 part by weight) by a known integral blend method.

Polyoxyethylene alkyl ether (nonionic surfactant) was used as a surfactant.

(1) Dilution to 168 times was performed by mixing 100 parts by weight of the aqueous dispersion liquid of polytetrafluoroethylene as the reagent of the fluorine resin and 0.6 parts by weight of decyltrimethoxysilane as the alkoxysilane.

Thereafter, the weight of the obtained diluted liquid was increased by 1.7 times by adding the inorganic filler to the diluted liquid, and 3.5 parts by weight of the surfactant was blended therein.

The resultant liquid was put into a sealed container, and the container is rotated, thereby preparing an application liquid (sol liquid) for forming an insulating substrate.

In the present example, the application liquid was prepared such that the amount of the alkoxysilane was 1 part by weight per 100 parts by weight of polytetrafluoroethylene (but, excluding decyltrimethoxysilane used for the surface treatment of the inorganic powder).

Figure 2:
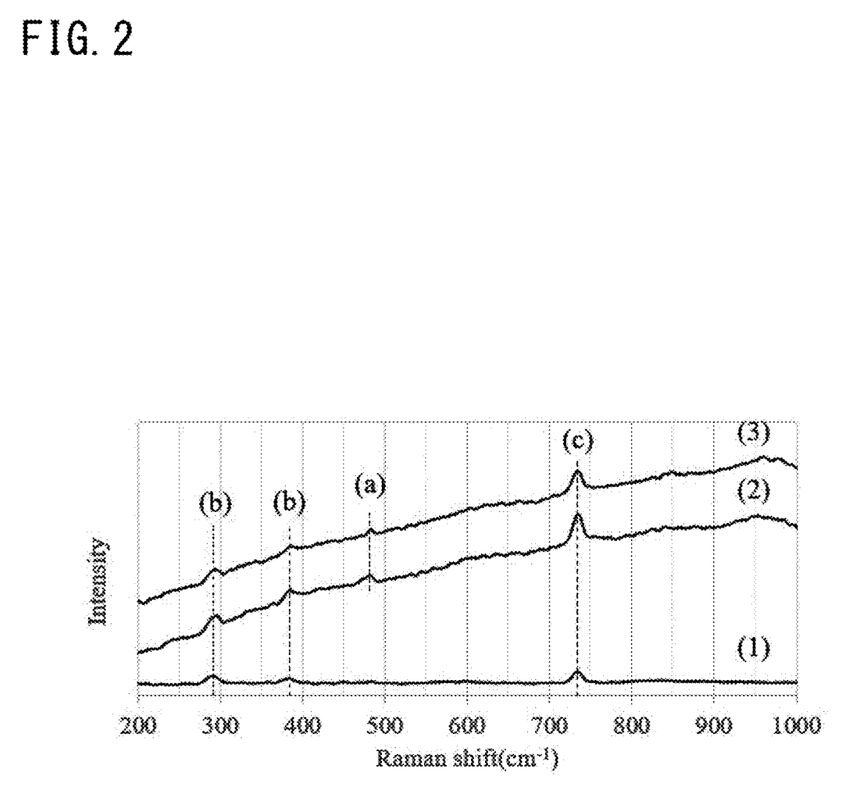
FIG. 2 shows Raman charts obtained through measurement in Example 1.

Here, a laser having a wavelength of 532 nm was applied to the above sol liquid by using a laser Raman spectrometer (uRaman-M, manufactured by TechnoSpex Pte Ltd.), thereby measuring a Raman shift. The result is shown in FIG. 2. In FIG. 2, a Raman chart (1) is the Raman chart obtained through the measurement in this step.

As shown in FIG. 2, in the measurement in this step, a Raman shift corresponding to a silanol group or a defect pair structure in the process in which the silanol group is condensed, was observed at approximately 298 $cm^{-1}$ and approximately 389 $cm^{-1}$ (see (b) in FIG. 2), and a Raman shift corresponding to —$CF_3$ which is a terminal group of polytetrafluoroethylene was observed at approximately 737 $cm^{-1}$ (see (c) in FIG. 2), but no Raman shift corresponding to siloxane bond was observed.

Furthermore, the sol liquid was frozen by nitrogen and then broken, and the broken surface of the frozen sol liquid was observed with a scanning electron microscope under freezing. The observation image is shown in FIG. 3A and FIG. 3B.

Figure 3A:
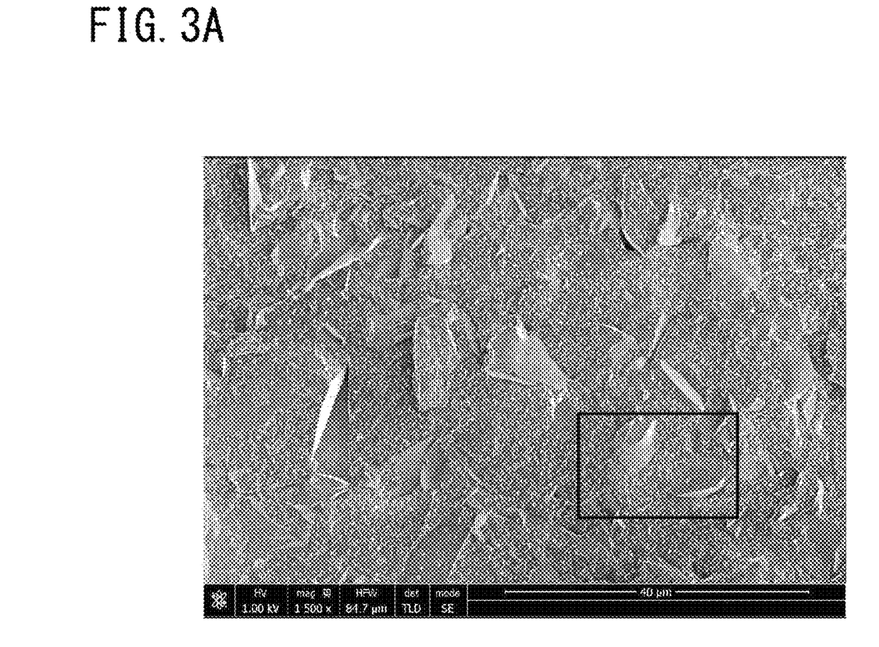
FIG. 3A is an electron micrograph taken in Example 1.
Figure 3B:
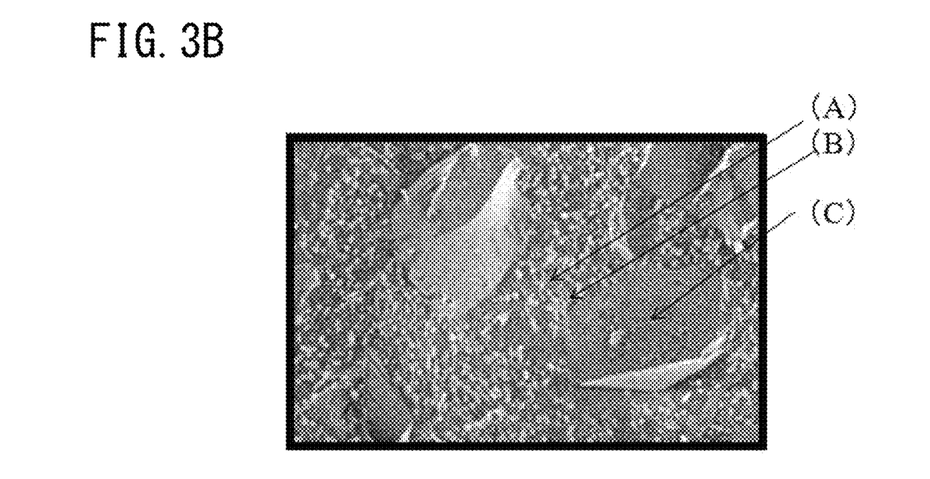
FIG. 3B is a partially enlarged view of FIG. 3A.

FIG. 3A is an electron micrograph (magnification: 1500 times) taken in Example 1, and FIG. 3B is a partially enlarged view of FIG. 3A.

As shown in FIG. 3A and FIG. 3B, a sea-island structure, in which a sea (A) containing the silanol spreads in gaps of an inorganic filler (C) containing amorphous silica as a main component and subjected to a surface treatment and polytetrafluoroethylene particles (B) are present so as to be enveloped in the sea (A) containing the silanol, was observed in the frozen sol liquid.

(2) Next, a doctor blade and an application apparatus including a heating furnace were used, the sol liquid prepared in the above (1) was poured before the doctor blade, a copper foil is placed, a speed at which the copper foil was to be fed during sol application was set to 0.2 m per minute, and the sol liquid was applied to one surface of the copper foil. Subsequently, the copper foil to which the sol liquid has been applied was transferred to the heating furnace, and the temperature within the furnace was increased from 80° C. to 320° C., and the sol liquid was gelled while a polycondensation reaction of a hydrolysate of decyltrimethoxysilane was carried out, thereby forming a gel layer on the copper foil. Here, the interior of the heating furnace was brought into a nitrogen atmosphere to prevent oxidation of the copper foil.

Here, a laser having a wavelength of 532 nm was applied to the above gel using the above laser Raman spectrometer, thereby measuring a Raman shift. The result is shown in FIG. 2. In FIG. 2, a Raman chart (2) is the Raman chart obtained through the measurement in this step.

As shown in FIG. 2, in the measurement in this step, a marked Raman shift indicating siloxane bond was also observed at approximately 485 $cm^{-1}$ (see (a) in FIG. 2).

(3) Next, a hot press including a mold was prepared, two copper foils each having a gel layer formed thereon were placed within the mold such that the gel layers faced each other, and heating and pressing were performed, whereby the two copper foils were thermally compression-bonded to each other via the gel layers.

Here, as the conditions for the thermal compression bonding, a temperature and a pressure that meet known conditions for molding polytetrafluoroethylene were used. In addition, after the heating and the pressing, the temperature was decreased to 121° C. or lower, and the thermally compression-bonded copper foil was taken out.

In this step, by the heating/pressing treatment, the gel layer became completely solidified, and the gel layer became an insulating substrate. That is, in this step, a laminated plate in which the copper foils are layered on both surfaces of the insulating substrate was obtained.

The copper foils were removed from the laminated plate obtained in this step, by etching, to obtain only the insulating substrate.

Thereafter, a laser having a wavelength of 532 nm was applied to the insulating substrate using the above laser Raman spectrometer, thereby measuring a Raman shift. The result is shown in FIG. 2. In FIG. 2, a Raman chart (3) is the Raman chart obtained through the measurement in this step.

As shown in FIG. 2, in the measurement in this step, a marked Raman shift indicating siloxane bond was observed at approximately 485 $cm^{-1}$ (see (a) in FIG. 2).

Figure 4:
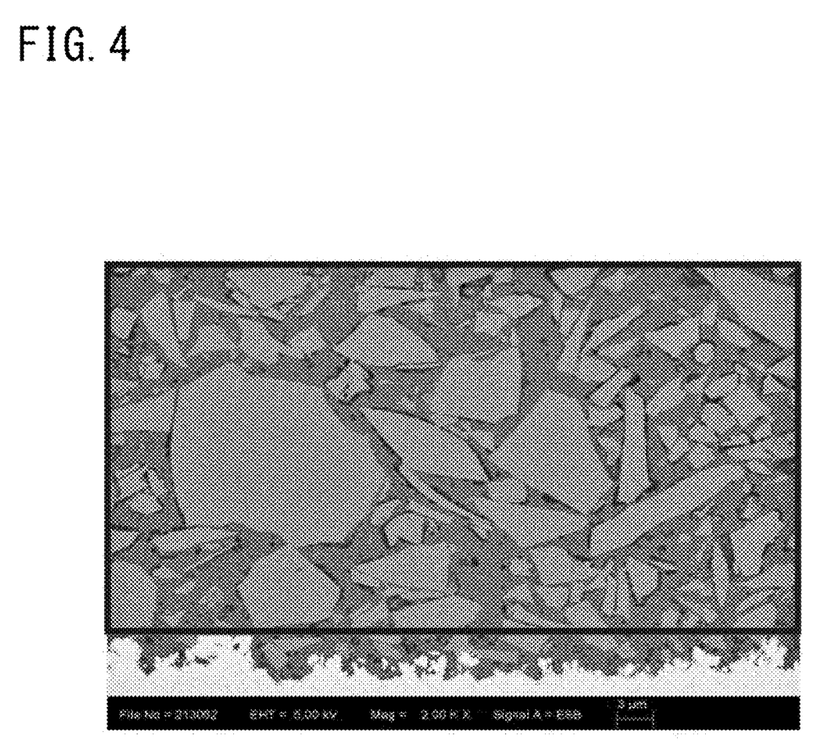
FIG. 4 is a reflected electron image taken with a scanning electron microscope in Example 1.

In addition, in order to observe the proportion of pores present within the insulating substrate that forms the laminated plate, a cross-section of the insulating substrate was exposed by using an ion beam, and observed with a scanning electron microscope, and a reflected electron image was obtained (see FIG. 4). FIG. 4 is a reflected electron image taken with the scanning electron microscope in this example, and is a representative reflected electron image within one field of view selected from among reflected electron images taken within ten fields of view.

Here, as shown in FIG. 4, an analysis range surrounded by a black frame was set within the observation image (the area S2 of the analysis range in FIG. 4: 1912.0 $\mu m^2$). Thereafter, signal intensity of the reflected electron image within the analysis range was divided to 256 levels with black being set to an intensity of 0 and with white being set to an intensity of 255, portions in which the signal intensity is not greater than 100 (portions that looked black) were extracted, and the area of the portions was calculated. As a result, the area S1 of the portions in which the signal intensity is not greater than 100 was 70.9 $\mu m^2$. The porosity calculated on the basis of the obtained areas S1 and S2 was 3.7%.

Furthermore, change over time of the dielectric tangent of the insulating substrate, which forms the laminated plate, in a high humidity environment was observed. The dielectric tangent was measured by a balanced-type circular disk resonator method. The balanced-type circular disk resonator method is the known method defined by the JPCA-FCL01 (2006) standard of the Japan Electronics Packaging and Circuits Association.

Here, the copper foil was etched, a resonator to be measured by the balanced-type circular disk resonator method was drawn on the insulating substrate, and then a desired number of insulating substrates including sheets each composed of a pure insulating substrate having no copper foil were stacked on each other. Thereafter, a frequency around 10 GHz was applied to the resonator, and the initial dielectric tangent of the above insulating substrate was measured.

Moreover, after the initial dielectric tangent was measured, the insulating substrate was left in an environment of 85° C. and 85% RH for up to 2000 hours with the insulating substrates kept stacked on each other. An operation, in which each time a predetermined time had elapsed, the insulating substrate was taken out and the dielectric tangent thereof was measured, was repeated until 2000 times. The result is shown in Table 1.

TABLE 1

| Time (hr) | Dielectric tangent |
|---|---|
| 0 | 0.000844 |
| 200 | 0.000868 |
| 500 | 0.000885 |
| 1000 | 0.000896 |
| 1500 | 0.000905 |
| 2000 | 0.000909 |

As a result, as shown in Table 1, whereas the initial dielectric tangent was about 0.0008, the dielectric tangent after elapse of 2000 hours was about 0.0009.

As presented above, in the insulating substrate that forms the laminated plate of the present example, a dielectric tangent less than 0.001 was maintained even after elapse of 2000 hours in the high humidity environment, and thus it is found that the laminated plate according to the embodiment of the present invention is a laminated plate having excellent high frequency characteristics.

Examples 2 to 11

Laminated plates were produced in the same manner as Example 1, except that the blending amount of decyltrimethoxysilane was changed as shown in Table 2 below.

Similar to Example 1, the blending amount of the alkoxysilane shown in Table 2 is the amount of the alkoxysilane blended per 100 parts by weight of polytetrafluoroethylene (but, excluding decyltrimethoxysilane used for the surface treatment of the inorganic powder).

For the produced laminated plates, similar to Example 1, a porosity was calculated and change over time of a dielectric tangent in a high humidity environment was observed. The result is shown in Table 2. In Table 2, the result of observation of change over time of the dielectric tangent is indicated as a rate of increase (%) of the dielectric tangent after elapse of 2000 hours. In addition, in Table 2, the result of Example 1 is also shown for reference.

TABLE 2

|  | Blending amount of alkoxysilane (parts by weight) | Porosity (%) | Rate of increase (%) |
|---|---|---|---|
| Example 1 | 1 | 3.7 | 1.08 |
| Example 2 | 0.1 | 5.4 | 1.31 |
| Example 3 | 0.3 | 4.7 | 1.24 |
| Example 4 | 0.5 | 4.2 | 1.17 |
| Example 5 | 0.8 | 3.9 | 1.14 |
| Example 6 | 2 | 3.6 | 1.07 |
| Example 7 | 3 | 3.7 | 1.07 |
| Example 8 | 4 | 4.5 | 1.18 |
| Example 9 | 5 | 6.3 | 1.43 |

TABLE 2-continued

|  | Blending amount of alkoxysilane (parts by weight) | Porosity (%) | Rate of increase (%) |
|---|---|---|---|
| Example 10 | 7 | 7.6 | 1.53 |
| Example 11 | 10 | 8.1 | 1.60 |

As is obvious from the results in Table 2, it is found that, in the laminated plate according to the embodiment of the present invention, by reducing the porosity of the insulating substrate to 5% or less, an increase in dielectric tangent over time can be significantly inhibited when the laminated plate is evaluated under a certain condition in a high humidity environment.

In addition, it is found that, in the case of producing a laminated plate by a method using a sol-gel method as described above, setting the blending amount of the alkoxysilane to 0.3 to 4 parts by weight per 100 parts by weight of polytetrafluoroethylene is suitable for making the porosity not greater than 5%. It is speculated that the reason for this is that: if the amount of the alkoxysilane is small, the amount of the alkoxysilane or its polymer that fills the gaps of the fluorine resin or the inorganic filler is insufficient; and if the amount of the alkoxysilane is excessively large, a sol-gel reaction of a liquid containing the alkoxysilane rapidly proceeds, and the liquid is less likely to enter the gaps of the fluorine resin or the inorganic filler due to the rapid gelation.

Comparative Example 1

A laminated plate was produced in the same manner as Example 1, except that decyltrimethoxysilane was not blended.

Figure 5:
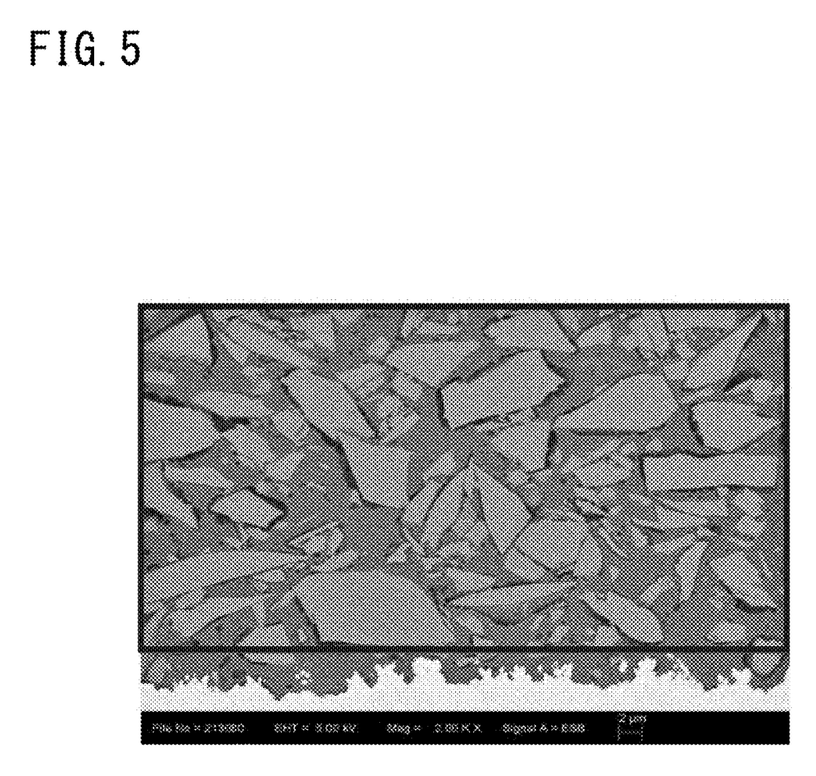
FIG. 5 is a reflected electron image taken with a scanning electron microscope in Comparative Example 1.

For the obtained laminated plate, similar to Example 1, a cross-section of the insulating substrate was exposed by using an ion beam, and observed with a scanning electron microscope, and a reflected electron image was obtained (see FIG. 5). FIG. 5 is a reflected electron image taken with the scanning electron microscope in this comparative example, and is a representative reflected electron image within one field of view selected from among reflected electron images taken within ten fields of view.

Thereafter, by the same method as Example 1, an analysis range (a portion surrounded by a black frame (area S2: 1912.0 μm²)) was set, and the area S1 (110.4 μm² in FIG. 5) of portions corresponding to pores within the analysis range was obtained. The porosity calculated on the basis of the obtained areas S1 and S2 was 5.8%.

Furthermore, for the obtained laminated plate, after the initial dielectric tangent thereof was measured, the insulating substrate was left in an environment of 85° C. and 85% RH for up to 2000 hours with insulating substrates kept stacked on each other. An operation, in which each time a predetermined time had elapsed, the insulating substrate was taken out and the dielectric tangent thereof was measured, was repeated until 2000 times. The result is shown in Table 3.

The dielectric tangent was measured by the same method as Example 1.

TABLE 3

| Time (hr) | Dielectric tangent |
|---|---|
| 0 | 0.000933 |
| 200 | 0.001114 |
| 500 | 0.001218 |
| 1000 | 0.001249 |

TABLE 3-continued

| Time (hr) | Dielectric tangent |
|---|---|
| 1500 | 0.001257 |
| 2000 | 0.001263 |

REFERENCE SIGNS LIST

10 laminated plate
11 insulating substrate
12 conductive layer

The invention claimed is:

1. A laminated plate having a metallic conductive layer on each surface of an insulating substrate, wherein
the insulating substrate consists of a fluorine resin and a polymer of an alkoxysilane, the fluorine resin is dispersed in the polymer of the alkoxysilane, and
wherein the fluorine resin is polytetrafluoroethylene (PTFE)
wherein the insulating substrate throughout consists of a porosity of not greater than 5%.

2. The laminated plate according to claim 1, wherein
the alkoxysilane is an alkyltrialkoxysilane, and
the number of carbon atoms of an alkyl group of the alkyltrialkoxysilane is 3 to 9.

3. A laminated plate having a metallic conductive layer on each surface of an insulating substrate, wherein
the insulating substrate consists of a fluorine resin, a polymer of an alkoxysilane and an inorganic filler, the fluorine resin is dispersed in the polymer of the alkoxysilane, and
wherein the fluorine resin is polytetrafluoroethylene (PTFE),
wherein the insulating substrate throughout consists of a porosity of not greater than 5%.

4. A laminated plate having a metallic conductive layer on each surface of an insulating substrate, wherein
the insulating substrate consists of a fluorine resin, a polymer of an alkoxysilane, and an inorganic filler, and the fluorine resin is dispersed in the polymer of the alkoxysilane,
the alkoxysilane is an alkyltrialkoxysilane,
the number of carbon atoms of an alkyl group of the alkyltrialkoxysilane is 3 to 9, and
the fluorine resin is polytetrafluoroethylene (PTFE),
wherein the insulating substrate throughout consists of a porosity of not greater than 5%.

* * * * *